US010284181B2

United States Patent
Natsume et al.

(10) Patent No.: US 10,284,181 B2
(45) Date of Patent: May 7, 2019

(54) VARIABLE CAPACITOR AND ELECTRONIC DEVICE

(71) Applicant: TAIYO YUDEN CO., LTD., Tokyo (JP)

(72) Inventors: Masashi Natsume, Tokyo (JP); Tomokazu Ikenaga, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/452,957

(22) Filed: Mar. 8, 2017

(65) Prior Publication Data

US 2018/0006634 A1 Jan. 4, 2018

(30) Foreign Application Priority Data

Jun. 30, 2016 (JP) ................................ 2016-130925

(51) Int. Cl.
*H01Q 1/50* (2006.01)
*H03J 3/20* (2006.01)

(52) U.S. Cl.
CPC . *H03J 3/20* (2013.01); *H01Q 1/50* (2013.01)

(58) Field of Classification Search
CPC .................................... H03J 3/20; H01Q 1/50
USPC ..................................................... 334/64, 78
See application file for complete search history.

(56) References Cited

U.S. PATENT DOCUMENTS

2005/0088799 A1 4/2005 Kusabe
2006/0018082 A1 1/2006 Yamagata et al.
2010/0056098 A1 3/2010 Kanno et al.
2011/0134582 A1 6/2011 Kanno
2014/0139968 A1 5/2014 Ikenaga et al.
2016/0133387 A1 5/2016 Kanno

FOREIGN PATENT DOCUMENTS

CN 1601674 A 3/2005
CN 1716481 A 1/2006
CN 103824695 A 5/2014

(Continued)

OTHER PUBLICATIONS

Chinese Office Action dated Aug. 10, 2018, in a counterpart Chinese patent application No. 201710159366.7. (A machine translation (not reviewed for accuracy) attached.).

(Continued)

*Primary Examiner* — Benny T Lee
*Assistant Examiner* — Hafizur Rahman
(74) *Attorney, Agent, or Firm* — Chen Yoshimura LLP

(57) ABSTRACT

A variable capacitor includes: capacitors connected in series between first and second signal terminals, capacitances of the capacitors varying in accordance with variable voltage applied to a variable terminal; a first resistor connected between a first node between adjacent capacitors of the capacitors and the variable terminal, a second resistor connected between a second node between adjacent capacitors of the capacitors and a fixed terminal applied with fixed voltage, and a third resistor connected between a third node and the fixed terminal, the third node being located between the first and/or second signal terminal and a capacitor located closest to the first and/or signal terminal among the capacitors, wherein a resistance of the second resistor is less than 1 and ½ or greater with respect to a resistance of the third resistor, and the resistance of the second resistor is not equal to a resistance of the first resistor.

6 Claims, 15 Drawing Sheets

(56) References Cited

FOREIGN PATENT DOCUMENTS

| | | | |
|---|---|---|---|
| CN | 204442303 | U | 7/2015 |
| CN | 105393466 | | 3/2016 |
| JP | 2005-064437 | A | 3/2005 |
| JP | 2008-066682 | A | 3/2008 |
| JP | 2010-055570 | A | 3/2010 |
| JP | 2011-119482 | A | 6/2011 |
| JP | 2014-103181 | A | 6/2014 |

OTHER PUBLICATIONS

Japanese Office Action dated Apr. 17, 2018, in a counterpart Japanese patent application No. 2016-130925. A machine translation (not reviewed for accuracy) attached.).

VARIABLE CAPACITOR AND ELECTRONIC DEVICE

CROSS-REFERENCE TO RELATED APPLICATION

This application is based upon and claims the benefit of priority of the prior Japanese Patent Application No. 2016-130925, filed on Jun. 30, 2016, the entire contents of which are incorporated herein by reference.

FIELD

A certain aspect of the present invention relates to a variable capacitor and an electronic device.

BACKGROUND

In, for example, Near Field Communication (NFC) modules and wireless power transfer modules, the variability in electrical characteristics of a coil used for an antenna and the usage environment cause a predetermined resonant frequency to change. With decrease in size of mobile terminals in recent years, antennas also decrease in size. Therefore, the change in resonant frequency becomes unacceptable in circuit design. Thus, to adjust the resonant frequency, it has been known to use a variable capacitor of which the capacitance varies in accordance with a DC bias voltage as disclosed in, for example, Japanese Patent Application Publication No. 2010-55570.

There have been also known variable capacitors in which a plurality of capacitors each including a dielectric layer of which the permittivity varies in accordance with a DC bias voltage are connected in series between input/output terminals, and a variable voltage is applied to the plurality of capacitors as disclosed in for example, Japanese Patent Application Publication Nos. 2010-55570, 2011-119482, 2008-66682, 2005-64437, and 2014-103181. It has been known to make the resistance of a bias resistor coupled to two capacitors approximately ½ of the resistance of a bias resistor coupled to one capacitor as disclosed in, for example, Japanese Patent Application Publication No. 2014-103181.

It has been desired to make the response of the capacitance change to the change of the variable voltage faster. However, when the response is made to be faster, the characteristics including a Q-value and the like deteriorate.

SUMMARY OF THE INVENTION

According to a first aspect of the present invention, there is provided a variable capacitor including: a plurality of capacitors that are connected in series between a first signal terminal and a second signal terminal, and of which capacitances vary in accordance with a variable voltage applied to a variable terminal, an AC signal being input to and output from the first signal terminal and the second signal terminal; a plurality of first resistors each connected between a corresponding one of a plurality of first nodes and the variable terminal, the plurality of first nodes being included in nodes between adjacent capacitors of the plurality of capacitors; one or more second resistors each connected between a corresponding one of one or more second nodes and a fixed terminal to which a fixed voltage is applied, the one or more second nodes being included in the nodes between the adjacent capacitors; and a third resistor that is connected between at least one of third nodes and the fixed terminal, one of the third nodes being located between the first signal terminal and a capacitor that is located closest to the first signal terminal among the plurality of capacitors, another one of the third nodes being located between the second signal terminal and a capacitor that is located closest to the second signal terminal among the plurality of capacitors, wherein all resistances of the one or more second resistors are less than 1 and equal to or greater than ½ with respect to a resistance of the third resistor, and each of the resistances of the one or more second resistors is not equal to at least one of resistances of the plurality of first resistors.

According to a second aspect of the present invention, there is provided a variable capacitor including: a plurality of capacitors that are connected in series between a first signal terminal and a second signal terminal, and of which capacitances vary in accordance with a variable voltage applied to a variable terminal, an AC signal being input to and output from the first signal terminal and the second signal terminal; a plurality of first resistors each connected between a corresponding one of a plurality of first nodes and the variable terminal, the plurality of first nodes being included in nodes between adjacent capacitors of the plurality of capacitors; one or more second resistors each connected between a corresponding one of one or more second nodes and a fixed terminal to which a fixed voltage is applied, the one or more second nodes being included in the nodes between the adjacent capacitors; and a third resistor that is connected between at least one of third nodes and the fixed terminal, one of the third nodes being located between the first signal terminal and a capacitor that is located closest to the first signal terminal among the plurality of capacitors, another one of the third nodes being located between the second signal terminal and a capacitor that is located closest to the second signal terminal among the plurality of capacitors, wherein at least one of resistances of the plurality of first resistors is less than 1 with respect to a resistance of the third resistor, and the at least one of the resistances of the plurality of first resistors is not equal to any one of resistances of the one or more second resistors.

According to a third aspect of the present invention, there is provided an electronic device including: the above variable capacitor.

DETAILED DESCRIPTION

Hereinafter, a description will be given of embodiments of the present invention with reference to the accompanying drawings.

First Embodiment

Figure 1:
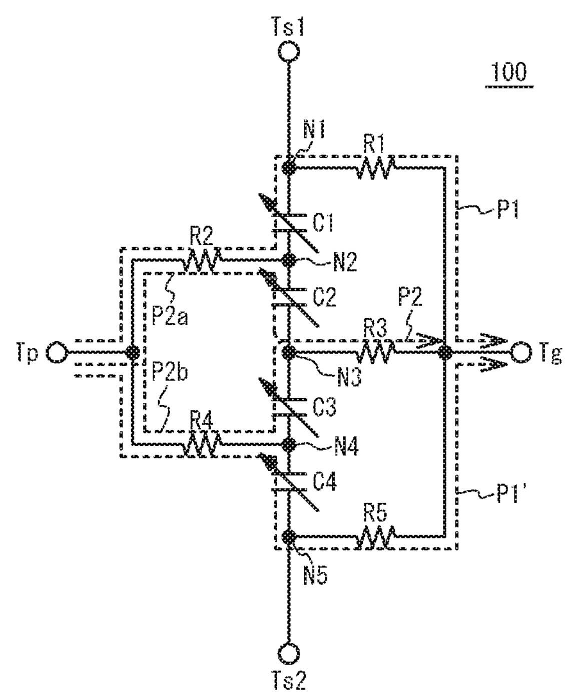
FIG. 1 is a circuit diagram of a variable capacitor with which a simulation 1 was performed in a first embodiment.

FIG. 1 is a circuit diagram of a variable capacitor 100 with which a simulation 1 was performed in a first embodiment. As illustrated in FIG. 1, capacitors C1 through C4 are connected in series between signal terminals Ts1 and Ts2. A resistor R1 is connected between a node N1, which is located closer to the signal terminal Ts1, of the capacitor C1 and a fixed terminal Tg. A resistor R2 is connected between a node N2, which is located between the capacitors C1 and C2, and a variable terminal Tp. A resistor R3 is connected between a node N3, which is located between the capacitors C2 and C3, and the fixed terminal Tg. A resistor R4 is connected between a node N4, which is located between the capacitors C3 and C4, and the variable terminal Tp. A resistor R5 is connected between a node N5, which is located closer to the signal terminal Ts2, of the capacitor C4 and the fixed terminal Tg.

For example, AC signals of 13.56 MHz are input to the signal terminals Ts1 and Ts2. A variable voltage as a DC bias voltage is applied to the variable terminal Tp. A fixed voltage such as a ground voltage is applied to the fixed terminal Tg. Each of the capacitors C1 through C4 includes a dielectric layer of which the permittivity does not change by a high-frequency signal, but changes when a low-frequency voltage is applied. Accordingly, when a variable voltage applied to the variable terminal Tp is changed, the capacitances of the capacitors C1 through C4 with respect to an AC signal change.

When the resistances of the resistors R1 through R5 are small, signals input to and output from the signal terminals Ts1 and Ts2 leak to the variable terminal Tp and the fixed terminal Tg through the resistors R1 through R5. Thus, the resistances of the resistors R1 through R5 are preferably more than 5000 times, more preferably more than 10000 times the impedance values of the capacitors C1 through C4. For example, when a signal input to and output from the signal terminals Ts1 and Ts2 has a frequency of 13.56 MHz and the capacitors C1 through C4 have capacitances of 400 pF, the impedances of the capacitors C1 through C4 are approximately 30Ω. Therefore, the resistances of the resistors R1 through R5 are preferably 150 kΩ or greater, more preferably 300 kΩ or greater.

When the resistances of the resistors R1 through R5 are large, a sufficient voltage is not applied to the capacitors C1 through C4. Thus, the resistances of the resistors R1 through R5 are preferably approximately 1/50 or less of, more preferably approximately 1/100 or less of the resistance components (the leakage resistance components) of the capacitors C1 through C4 due to leakage current. For example, when the leakage resistance components of the capacitors C1 through C4 are 50 GΩ, the resistances of the resistors R1 through R5 are preferably 1 GΩ or less, more preferably 500 MΩ or less.

Figure 2:
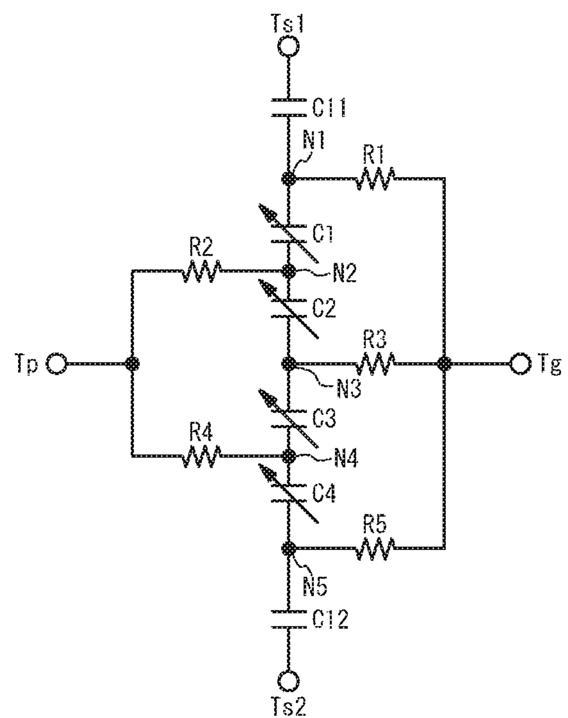
FIG. 2 is a circuit diagram of a variable capacitor including a DC cut capacitor in the first embodiment.

FIG. 2 is a circuit diagram of a variable capacitor including a DC cut capacitor in the first embodiment. As illustrated in FIG. 2, a Direct Current (DC) cut capacitor C11 is connected between the node N1 and the signal terminal Ts1. A DC cut capacitor C12 is connected between the node N5 and the signal terminal Ts2. The DC cut capacitors C11 and C12 are capacitors that remove a DC component between the signal terminals Ts1 and Ts2. The DC cut capacitors C11 and C12 have capacitances greater than those of the capacitors C1 through C4. Additionally, the capacitances of the DC cut capacitors C11 and C12 are not purposefully made to be variable. Other structures are the same as those of FIG. 1, and the description thereof is thus omitted.

To inhibit a DC bias current from leaking to signals input to or output from the variable capacitor, the DC cut capacitors C11 and C12 are usually connected to pathways, to/from which signals are input/output, of the capacitors C1 and C4, respectively. So-called variable capacitors may or may not include the DC cut capacitors C11 and C12. When manufactured as a component of a variable capacitor, the DC cut capacitors C11 and C12 are sometimes integrated with the capacitors C1 through C4, and sometimes are not integrated with the capacitors C1 through C4 and are installed outside the signal terminals Ts1 and Ts2. For example, in the variable capacitor of the circuit illustrated in FIG. 1, the DC cut capacitors are coupled to the outside of the signal terminals Ts1 and Ts2. The first embodiment will mainly describe a variable capacitor in which the DC cut capacitors C11 and C12 are exteriorly installed, but the first embodiment can be applied to a variable capacitor in which the DC cut capacitors C11 and C12 are integrated.

Generally, the connection between capacitors (excluding the DC cut capacitors C11 and C12. Hereinafter, the term "a capacitor" includes neither the DC cut capacitor C11 or C12) constituting a variable capacitor and the variable terminal Tp and the fixed terminal Tg can be achieved in two different ways: the one illustrated in FIG. 2 and the one illustrated in the following FIG. 3.

Figure 3:
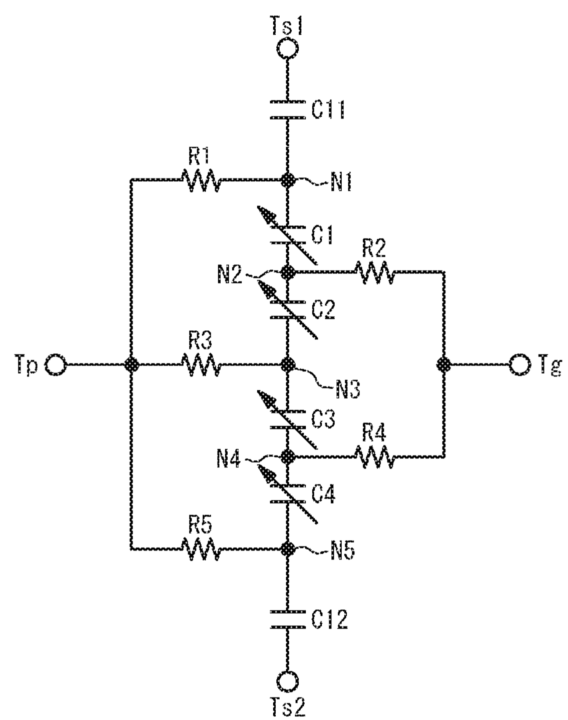
FIG. 3 is a circuit diagram of a variable capacitor compared to the first embodiment.

In FIG. 3, the nodes N1, N3, and N5 are coupled not to the fixed terminal Tg in FIG. 2 but to the variable terminal Tp through the resistors R1, R3, and R5, respectively. On the contrary, the nodes N2 and N4 are coupled not to the variable terminal Tp in FIG. 2 but to the fixed terminal Tg through the resistors R2 and R4, respectively. Other structures are the same between FIG. 2 and FIG. 3, and the description thereof is thus omitted. As illustrated in FIG. 3, when the nodes N1 and N5 are coupled to the variable terminal Tp, a difference in potential is generated between the node N3 and the signal terminals Ts1 and Ts2 when the variable voltage applied from the variable terminal Tp changes. This is due to the charge and discharge of the DC cut capacitors C11 and C12. Assume that the capacitances of the capacitors C1 through C4 are several hundreds of picofarads, and the capacitances of the DC cut capacitors C11 and C12 are tens of nanofarads. Since the time constant is proportional to resistance×capacitance, the extremely large time constants of the DC cut capacitors C11 and C12 make the time constant of the variable capacitor as a whole large. As described above, when the nodes N1 and N5 respectively connected between the signal terminals Ts1 and Ts2 and the capacitors C1 and C4 constituting the variable capacitor are coupled to the variable terminal Tp, the response time increases. In FIG. 2, since the nodes N1 and N5 are coupled to the fixed terminal Tg, this phenomenon does not occur.

Based on the above description, hereinafter, assume, as a circuit constituting a variable capacitor, a circuit in which the nodes N1 and N5 respectively connected between the signal terminals Ts1 and Ts2 and the capacitors C1 and C4 constituting a variable capacitor are coupled to the fixed terminal Tg as illustrated in FIG. 2. Excluded is a case where the nodes N1 and N5 respectively connected between the signal terminals Ts1 and Ts2 and the capacitors C1 and C4 constituting a variable capacitor are coupled to the variable terminal Tp as illustrated in FIG. 3. When an odd number of capacitors constitute a variable capacitor, one of two nodes, which are coupled to the signal terminals Ts1 and Ts2, of the capacitors may be coupled to the variable terminal Tp. Thus, hereinafter, the number of capacitors constituting a variable capacitor is mainly assumed to be an even number.

In the first embodiment, to reduce the response time of the capacitance change when the variable voltage changes, the nodes N1 and N5 are coupled to the fixed terminal Tg through the resistors R1 and R5, respectively. The response time in the first embodiment was simulated.

Simulation 1

The response time of the capacitance when the variable voltage changes is determined by the charge/discharge time of the capacitors C1 through C4. As the resistances of the resistors R1 through R5 are reduced, the charge/discharge time decreases. However, when the resistances of the resistors R1 through R5 are reduced, the AC signal leaks to the variable terminal Tp and the fixed terminal Tg, and the Q-value and the like thereby deteriorate. To make the response of the capacitance change faster, and inhibit the deterioration of the characteristics, the resistance of the resistor that contributes to the reduction of the charge/discharge time is to be reduced, and the resistance of the resistor that does not contribute to the reduction of the charge/discharge time is not to be reduced among the resistors R1 through R5. Thus, the resistances of the resistors R1 through R5 were varied to simulate the response time.

As illustrated in FIG. 1, there are three pathways through which current flows from the variable terminal Tp to the fixed terminal Tg while charging and discharging the capacitors C1 through C4. A pathway P1 is a pathway passing the variable terminal Tp, the resistor R2, the node N2, the capacitor C1, the node N1, the resistor R1, and the fixed terminal Tg in this order. A pathway P1' is a pathway passing the variable terminal Tp, the resistor R4, the node N4, the capacitor C4, the node N5, the resistor R5, and the fixed terminal Tg in this order.

A pathway P2 is separated in parallel into pathways P2*a* and P2*b* between the variable terminal Tp and the node N3. The pathway P2*a* is a pathway passing the variable terminal Tp, the resistor R2, the node N2, the capacitor C2, and the node N3 in this order. The pathway P2*b* is a pathway passing the variable terminal Tp, the resistor R4, the node N4, the capacitor C3, and the node N3 in this order. The pathway P2 into which the pathways P2*a* and P2*b* merge at the node N3 passes the node N3, the resistor R3, and the fixed terminal Tg in this order.

When the constants on the circuit such as the resistances and capacitances of the pathways P1, P1', and P2 are determined, the time constant of each of the pathways P1, P1', and P2 can be calculated by integrating the equation of voltage drop. The value that is three times the largest time constant among the time constants of the pathways P1, P1', and P2 was specified to be the response time of the variable capacitor 100. In the following description, in accordance with customary practice, the same reference numeral is used for a resistor and the corresponding resistance (for example, R1 through R5), and the same reference numeral is used for a capacitor and the corresponding capacitance (for example, C1 through C4).

The capacitances C1 through C4 were set to the same value, and the resistances R1 through R5 were set to the same value. The capacitances and the resistances were set as follows.

$$C1=C2=C3=C4=400\ \text{pF}$$

$$R1=R2=R3=R4=R5=R0=500\ \text{k}\Omega$$

The response time under this configuration is 3700 μs. The initial values of the resistances R1 through R5 were set to 500 kΩ.

Only one of the resistances R1 through R5 was varied, other resistances were fixed to the initial value R0, and the response time was calculated. Since the resistors R1 and R5 are symmetrical to each other, and the resistors R2 and R4 are symmetrical to each other, the resistances R1 through R3 were calculated.

Figure 4A:
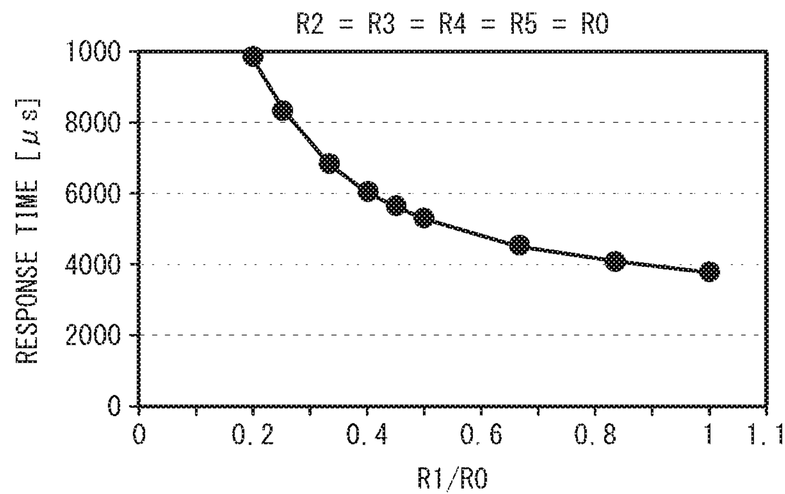
FIG. 4A is a graph of response time versus R1/R0.
Figure 4B:
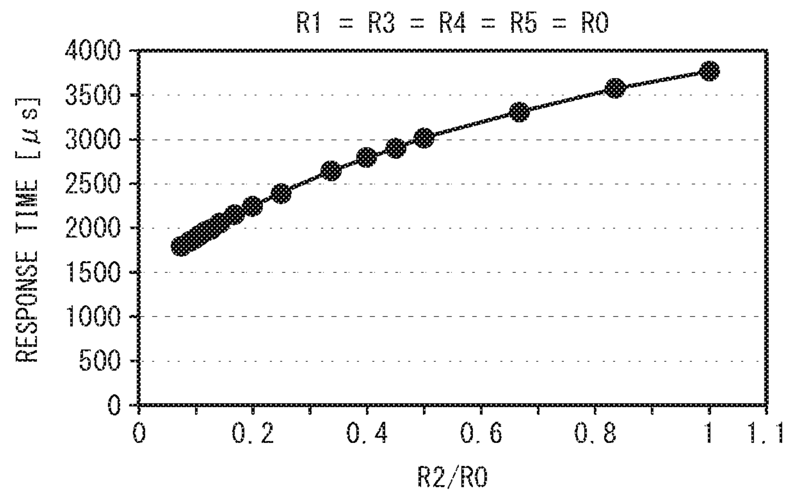
FIG. 4B is a graph of response time versus R2/R0.
Figure 4C:
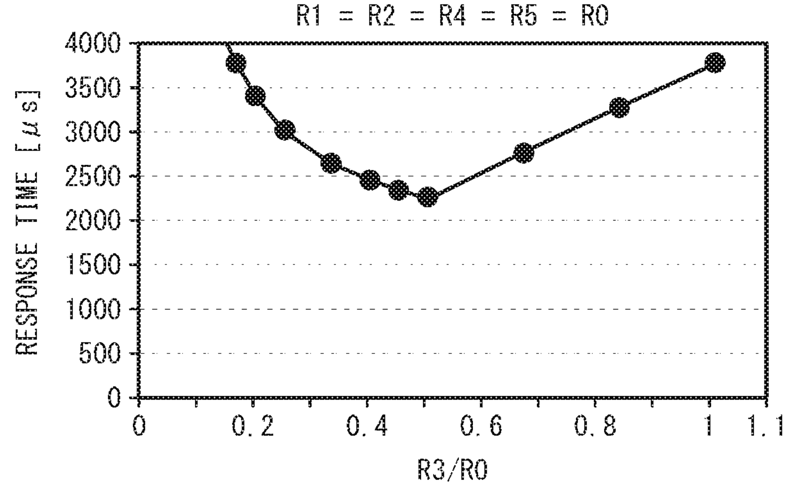
FIG. 4C is a graph of response time versus R3/R0.

FIG. 4A is a graph of response time versus R1/R0, FIG. 4B is a graph of response time versus R2/R0, and FIG. 4C is a graph of response time versus R3/R0. The resistances other than the resistance that was varied were set to the initial value R0=500 kΩ. As illustrated in FIG. 4A, as R1/R0 is reduced, the response time increases. As illustrated in FIG. 4B, as R2/R0 is reduced, the response time decreases. As illustrated in FIG. 4C, when R3/R0 is reduced, the response time becomes shorter than the response time when R2/R0 was varied in the range where R3/R0 is less than 1 and equal to or greater than ½. However, when R3/R0 is made to be less than ½, the response time rapidly increases. As described above, when one resistance is varied, in the range where the resistance with respect to R0 is less than 1 and equal to or greater than ½, the response time becomes the shortest when the resistances R3 is reduced.

Figure 5A:
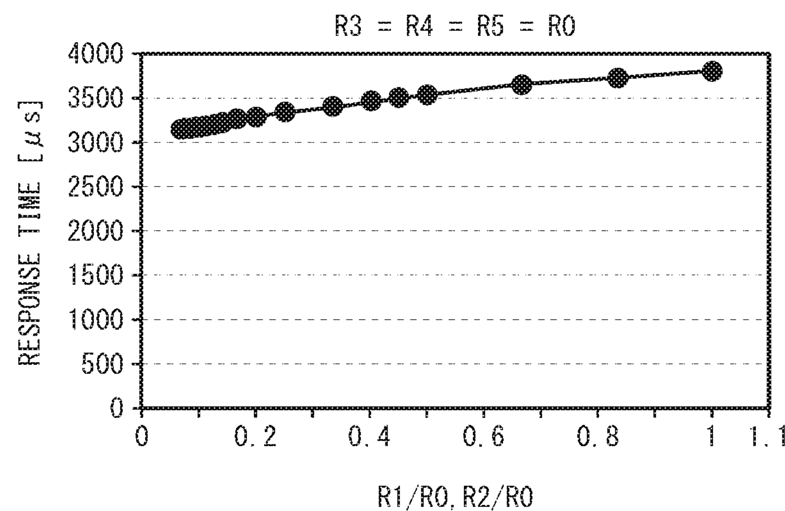
FIG. 5A is a graph of response time versus R1/R0 and R2/R0.

Next, more than one resistance was varied. FIG. 5A is a graph of response time versus R1/R0 and R2/R0. The resistances R1 and R2 in the pathway P1 were varied while having the same value, and other resistances were fixed to the initial value R0. As illustrated in FIG. 5A, the response time hardly changes even if the resistances R1/R0 and R2/R0 of the pathway P1 (the pathway P1' is symmetrical to the pathway P1, and therefore, the same applies to the pathway P1') are reduced. This corresponds to the fact that the response time increases as R1/R0 is reduced as illustrated in FIG. 4A. Thus, the reduction of the resistances of the pathways P1 and P1' does not contribute to the reduction of the response time.

Figure 5B:
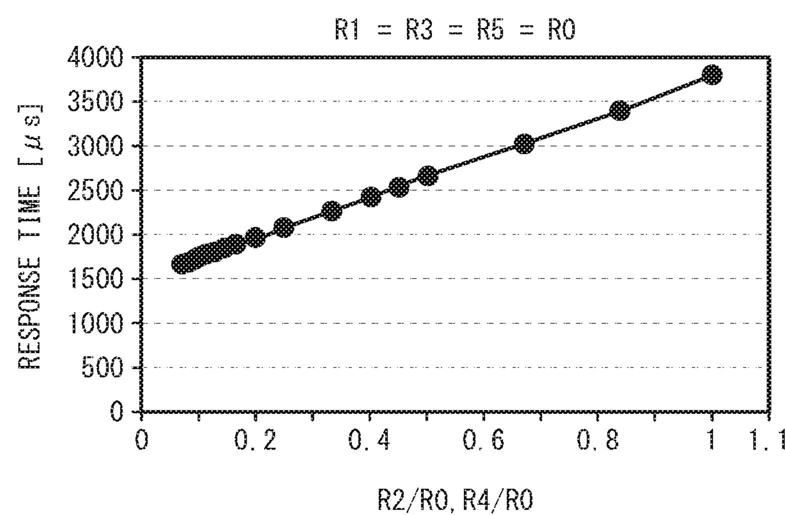
FIG. 5B is a graph of response time versus R2/R0 and R4/R0.

FIG. 5B is a graph of response time versus R2/R0 and R4/R0. The resistances R2 and R4 closer to the variable terminal Tp in the pathway P2 were varied while having the same value, and other resistances were fixed to the initial value R0. As illustrated in FIG. 5B, even if R2/R0 and R4/R0 are reduced, the response time differs little from that of FIG. 4B. Thus, even if the resistances R2 and R4 are reduced, the response time differs little from the response time when only the resistance R2 (or R4) is reduced.

Figure 6A:
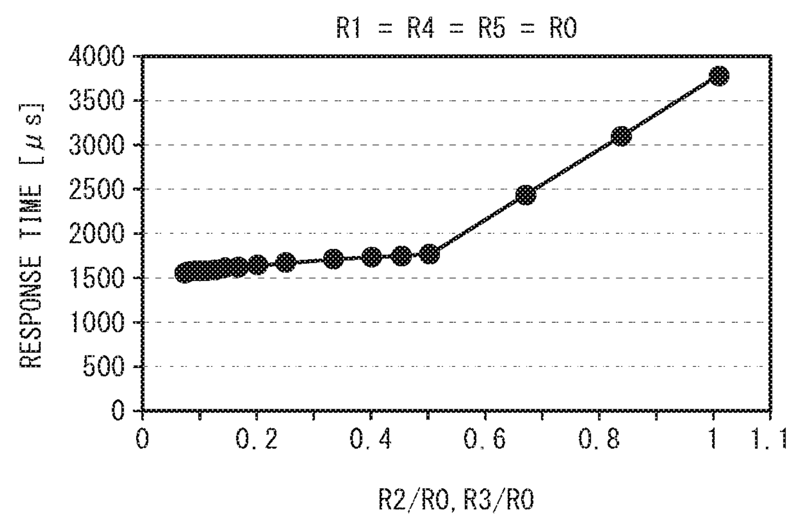
FIG. 6A is a graph of response time versus R2/R0 and R3/R0.

FIG. 6A is a graph of response time versus R2/R0 and R3/R0. One resistance R2 of the resistances R2 and R4 closer to the variable terminal Tp in the pathway P2 and the resistance R3 closer to the fixed terminal Tg were varied while having the same value, and other resistances were fixed to the initial value R0. As illustrated in FIG. 6A, when R2/R0 and R3/R0 are reduced, the response time rapidly decreases with the decrease in resistance in the range where R2/R0 and R3/R0 are less than 1 and equal to or greater than ½. In the range of less than ½, the response time decreases a little with the decrease in resistance. As described above, the response time decreases when the resistances R2 and R3 in the pathway P2*a* (the pathway P2*b* is symmetrical to the pathway P2*a*, and thus the same applies to the pathway P2*b*) of the pathway P2 are reduced. The reason why the decrease in response time with the decrease in resistance is small in the range where R2/R0 and R3/R0 are less than ½ is considered because the response time increases when R3/R0 becomes less than ½ as illustrated in FIG. 4C.

Figure 6B:
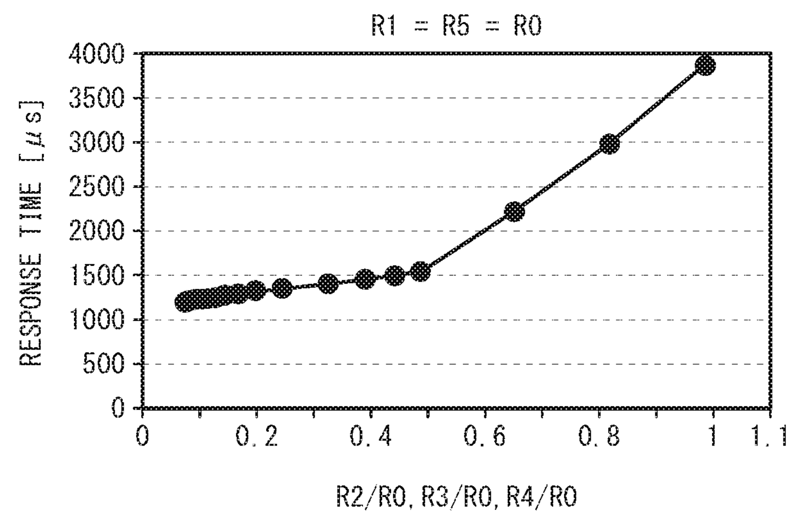
FIG. 6B is a graph of response time versus R2/R0, R3/R0, and R4/R0.

FIG. 6B is a graph of response time versus R2/R0, R3/R0, and R4/R0. All the resistances R2 through R4 in the pathway P2 were varied while having the same value, and other resistances were set to the initial value R0. As illustrated in FIG. 6B, when R2/R0, R3/R0, and R4/R0 are reduced, the response time rapidly decreases with the decrease in resistance in the range where R2/R0, R3/R0, and R4/R0 are less than 1 and equal to or greater than ½. In the range of less than ½, the response time decreases a little with the decrease in resistance. At the same resistances, the response time further decreases compared to that of FIG. 6A. As described above, when the resistances R2 through R4 in the pathway P2 are reduced, the response time further decreases.

In FIG. 6A and FIG. 6B, when R2/R0 and R4/R0 are made to be less than ½, R3/R0 is also made to be less than ½. As illustrated in FIG. 4C, when R3/R0 is made to be less than ½, the response time increases. Thus, R3/R0 was fixed to ½.

Figure 7A:
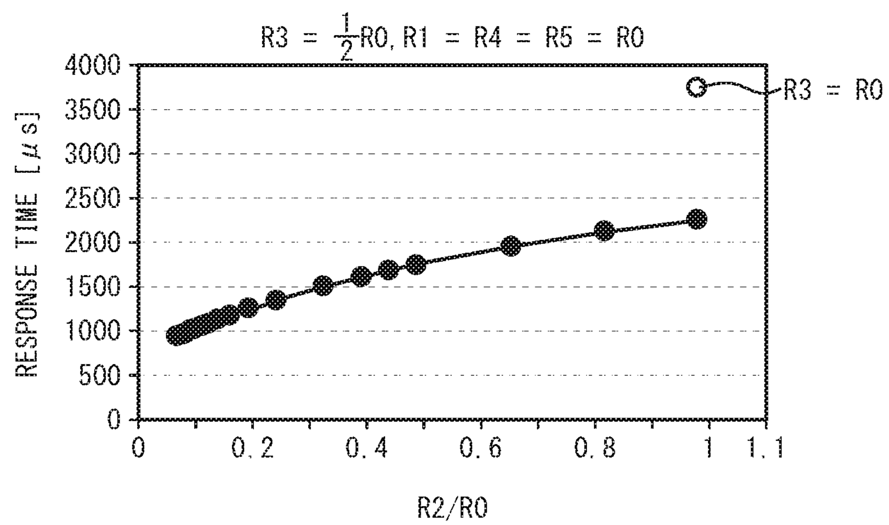
FIG. 7A is a graph of response time versus R2/R0 when R3/R0 was fixed to ½.

FIG. 7A is a graph of response time versus R2/R0 when R3/R0 was fixed to ½. Other resistances were fixed to the initial value R0. The open circle indicates R3/R0=1. As illustrated in FIG. 7A, when R2/R0 is reduced, the response time further decreases compared to that of FIG. 6A. Especially in the range where R2/R0 is less than ½, the response time becomes shorter.

Figure 7B:
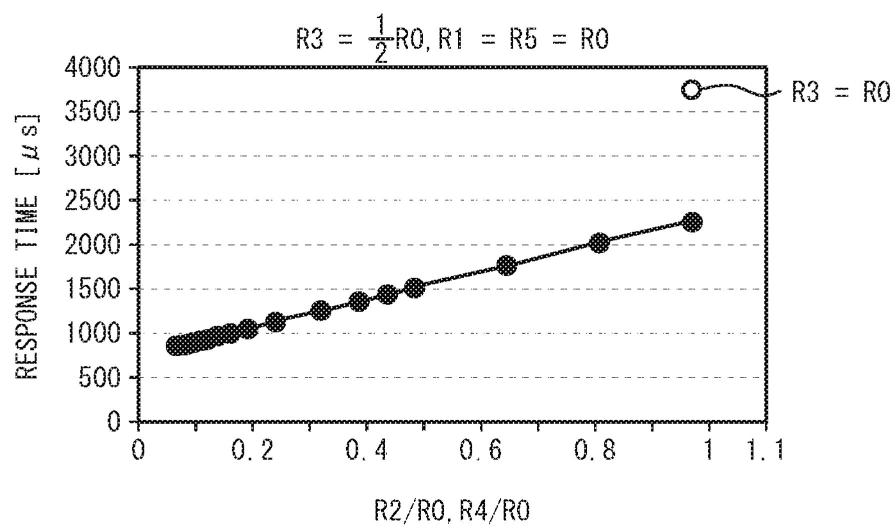
FIG. 7B is a graph of response time versus R2/R0 and R4/R0 when R3/R0 was fixed to ½.

FIG. 7B is a graph of response time versus R2/R0 and R4/R0 when R3/R0 was fixed to ½. Other resistances were fixed to the initial value R0. The open circle indicates R3/R0=1. As illustrated in FIG. 7B, when R2/R0 and R4/R0 are reduced, the response time becomes shorter than that of FIG. 6B. Especially in the range where R2/R0 and R4/R0 are less than ½, the response time becomes shorter.

As illustrated in FIG. 7A and FIG. 7B, when the resistance R3 is fixed to ½ that is the initial value R0, and the resistance R2 (or the resistances R2 and R4) is made to be less than 1, the response time further decreases. When the resistance R2 (or the resistances R2 and R4) is made to be less than the resistance R3, the response time still further decreases.

As described above, the response time can be reduced by making R3/R0 less than 1 and equal to or greater than ½, and making R2/R0 (or R2/R0 and R4/R0) different from R3/R0. R2/R0 (or R2/R0 and R4/R0) is preferably less than 1, more preferably less than ½.

Simulation 2

Figure 8:
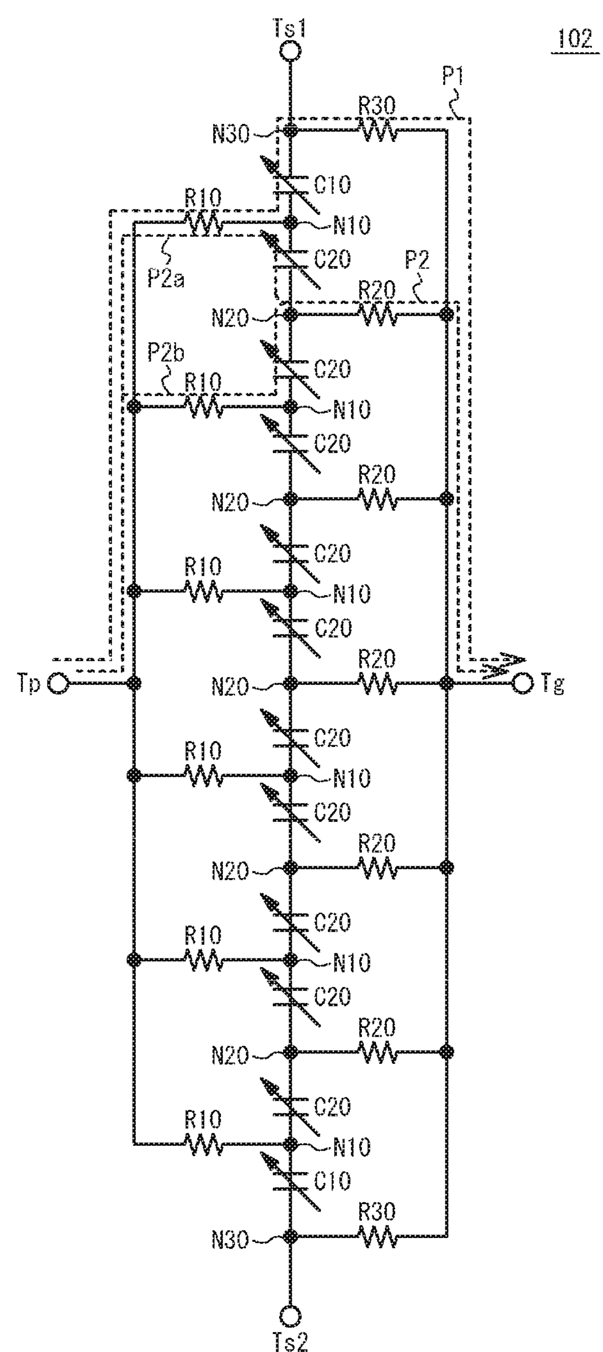
FIG. 8 is a circuit diagram of a variable capacitor with which a simulation 2 was performed in the first embodiment.

The similar simulation was performed on a variable capacitor in which 12 capacitors are connected in series. FIG. 8 is a circuit diagram of a variable capacitor with which a simulation 2 was performed in the first embodiment. As illustrated in FIG. 8, in a variable capacitor 102, 12 capacitors C10 and C20 are connected in series between the signal terminals Ts1 and Ts2. The capacitors closest to the signal terminals Ts1 and Ts2 are represented as the capacitors C10, and other capacitors are represented as the capacitors C20. Resistors R30 are connected between nodes N30, located closer to the signal terminals Ts1 and Ts2, of the capacitors C10 and the fixed terminal Tg. Resistors R10 are connected between the variable terminal Tp and nodes N10 between the capacitors. Resistors R20 are connected between the fixed terminal Tg and nodes N20 between the capacitors.

The number of the pathways P1 passing the variable terminal Tp, the resistor R10, the node N10, the capacitor C10, the node N30, the resistor R30, and the fixed terminal Tg in this order is two. The number of the pathways P2 passing the variable terminal Tp, the resistor R10, the node N10, the capacitor C20, the node N20, the resistor R20, and the fixed terminal Tg in this order is five. The pathways P2*a* and P2*b* are connected in parallel to the pathway that passes the variable terminal Tp, the resistor R10, the node N10, the capacitor C20, and the node N20 in this order of the pathway P2.

A method of the simulation was the same as that of the simulation 1. The capacitances C10 and C20, the resistances R10 through R30, and the initial value R0 were set as follows.

$$C10=C20=400\text{ pF}$$

$$R10=R20=R30=R0=500\text{ k}\Omega$$

The resistances R20 and R30 closer to the fixed terminal Tg were fixed, and the resistances R10 closer to the variable terminal Tp were varied. Since the number of the resistors R10 is six, the number of the resistors R10 of which the resistance is varied among the resistors R10 are varied from one to six. When the number is six, it means all the resistances R10 are varied. The resistance of the resistor R10 of which the resistance is varied is represented by R10'.

Figure 9A:
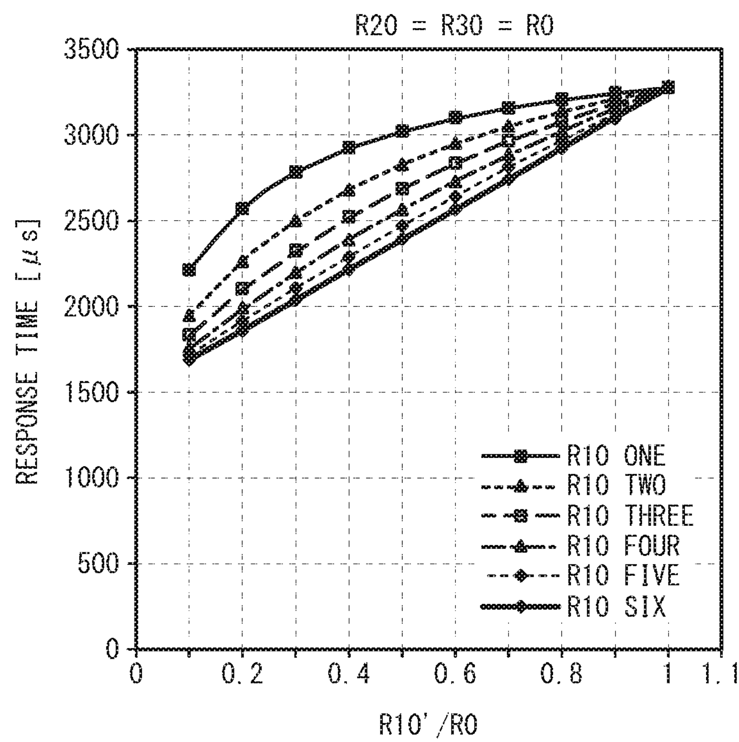
FIG. 9A is a graph of response time versus R107120.

FIG. 9A is a graph of response time versus R10'/R0. The resistances R10 not to be varied are fixed to the initial value R0, and the resistances R20 and R30 are fixed to the initial value R0. As illustrated in FIG. 9A, even when the number of the resistors R10 of which the resistance R10' is reduced is one, the response time decreases. As the number of the resistors R10 of which the resistance R10' is reduced increases, the response time further decreases.

Next, the resistances R10 and R30 were fixed, and the resistances R20 closer to the fixed terminal Tg in the pathways P2 were varied. The number of the resistors R20 of which the resistance is varied among the resistors R20 was varied from one to five. When the number is five, it means that all the resistances R20 are varied. The resistance of the resistor R20 of which the resistance is varied is represented by R20'.

Figure 9B:
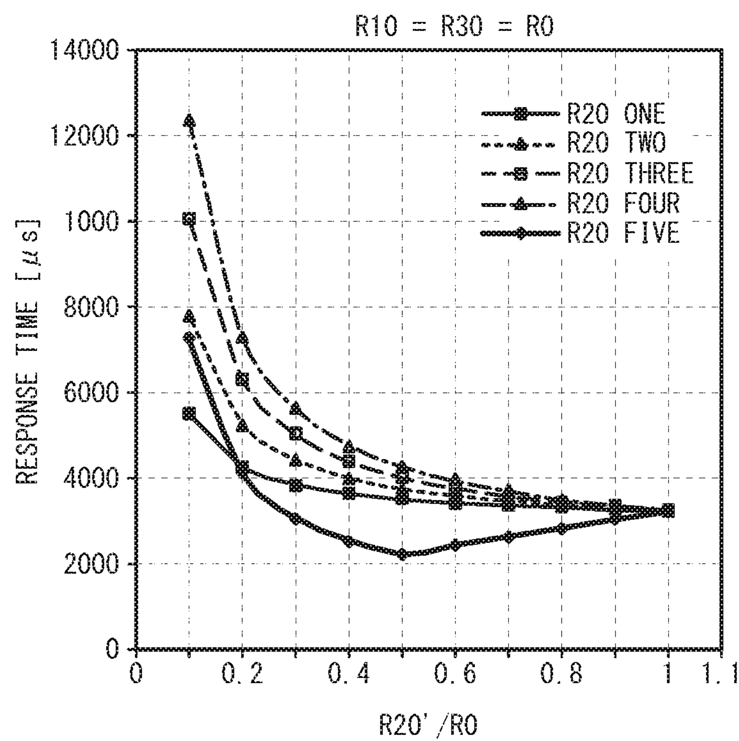
FIG. 9B is a graph of response time versus R20'/R0.

FIG. 9B is a graph of response time versus R20'/R0. The resistances R20 not to be varied are fixed to the initial value R0, and the resistances R10 and R30 are fixed to the initial value R0. As illustrated in FIG. 9B, when the number of the resistors R20 of which the resistance R20' is reduced is one, the response time increases when R20'/R0 is made to be less than 1. The same applies when the number of the resistors R20 of which the resistance R20' is reduced is one to four. When R20'/R0 is made to be less than 1 in all the resistors R20, the response time decreases.

As described above, at the variable terminal Tp side, when the resistance of one resistor R10 is reduced, the response time decreases. In contrast, at the fixed terminal Tg side, unless all the resistances of the resistors R20 are reduced, the response time does not decrease. This reason is unclear, but may be considered as follows, for example. At the fixed terminal Tg side, when at least one of the resistances R20 is fixed to the initial value R0, the response time is limited by the pathway of which the time constant of charge and discharge is the largest. Thus, at the fixed terminal Tg side, the reduction of one resistance R20 does not affect the adjacent pathway P2. On the other hand, at the variable terminal Tp side, the reduction of one resistance R10 affects the adjacent pathway P2. Accordingly, it is considered that one resistance R10 affects the overall response time.

The number of pathways of which the resistances R10 and R20 are varied among the five pathways P2 was varied to simulate the response time. Since the pathway P2 includes the pathways P2*a* and P2*b*, the simulation was conducted on a case where the resistances R10 and R20 of only the pathway P2*a* (the same applies to the pathway P2*b*) are varied and on a case where the resistances R10 and R20 of both the pathways P2*a* and P2*b* are varied. The resistance of the resistor R10 of which the resistance is varied is represented by R10", and the resistance of the resistor R20 of which the resistance is varied is represented by R20".

Figure 10A:
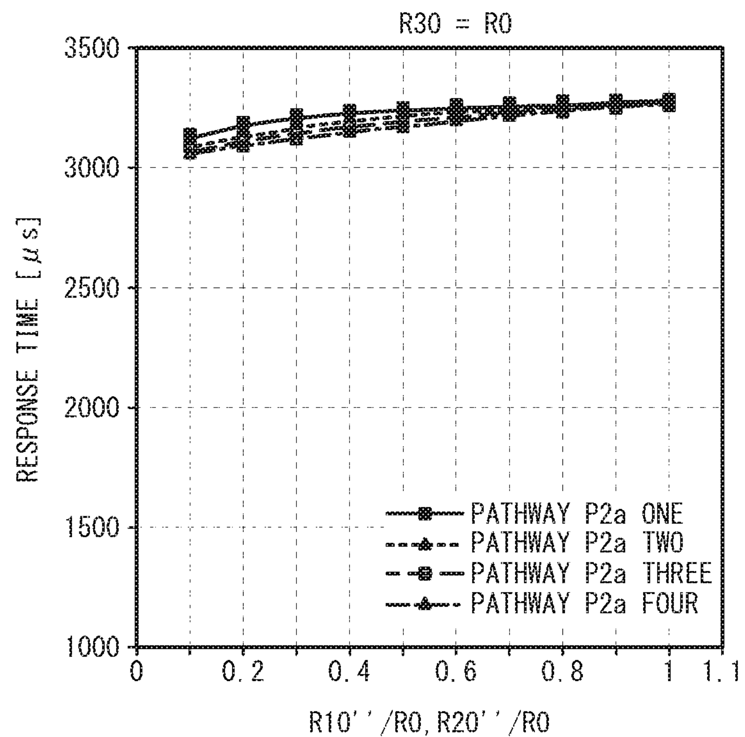
FIG. 10A is a graph of response time versus R10"/R0 and R20"/R0 of one of pathways.

FIG. 10A is a graph of response time versus R10"/R0 and R20"/R0 in one pathway P2*a*. The resistances R10 and R20 not to be varied are fixed to the initial value R0, and R30 are fixed to the initial value R0. The number of the pathways P2*a* of which the resistance is varied was varied from one to four. As illustrated in FIG. 10A, when the number of the pathways P2*a* of which the resistance is varied is one to four, the response time hardly changes.

Figure 10B:
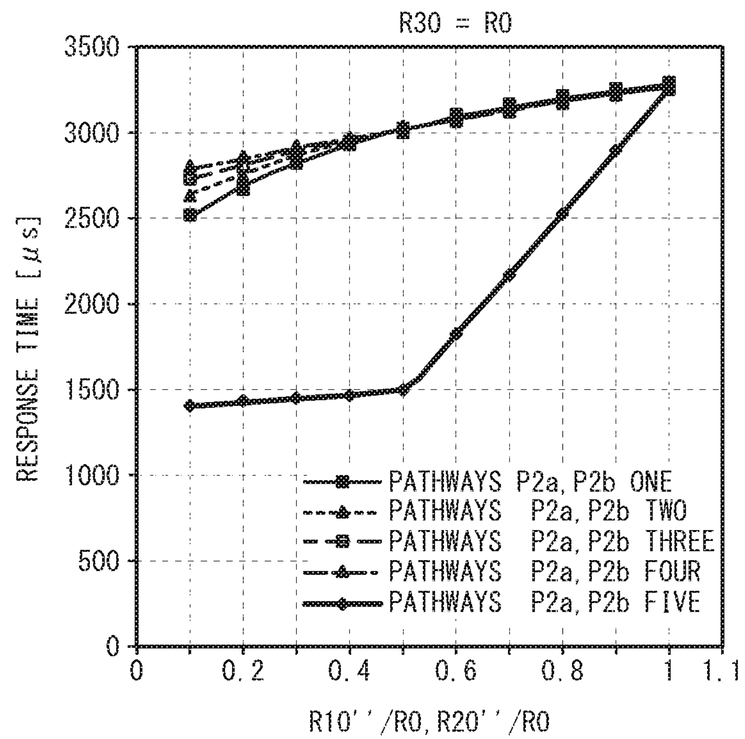
FIG. 10B is a graph of response time versus R10"/R0 and R20"/R0 of both pathways.

FIG. 10B is a graph of response time versus R10"/R0 and R20"/R0 in both the pathways P2*a* and P2*b*. The resistances R10 and R20 not to be varied are fixed to the initial value R0, and R30 are fixed to the initial value R0. The numbers of the pathways P2*a* and P2*b* of which the resistance is varied were varied from one to five. When the number is five, it means that the resistances of the resistors R10 and R20 in all the pathways P2 are varied. As illustrated in FIG. 10B, when the number of the pathways P2 of which the resistance is varied is one to four, the response time hardly changes. When the resistances R10 and R20 of all the pathways P2 are made to be less than 1, the response time decreases.

In FIG. 10A and FIG. 10B, the resistance R20 becomes less than ½ that is the initial value R0. Thus, the simulation was conducted on a case where all the resistances R20 are made to be ½ of the initial value R0, and the resistances R10 in only the pathway P2*a* are varied as in FIG. 10A and on a case where all the resistances R20 are made to be ½ of the initial value R0, and the resistances R10 in both the pathways P2*a* and P2*b* are varied as in FIG. 10B. The resistance of the resistor R10 of which the resistance is varied is represented by R10".

Figure 11A:
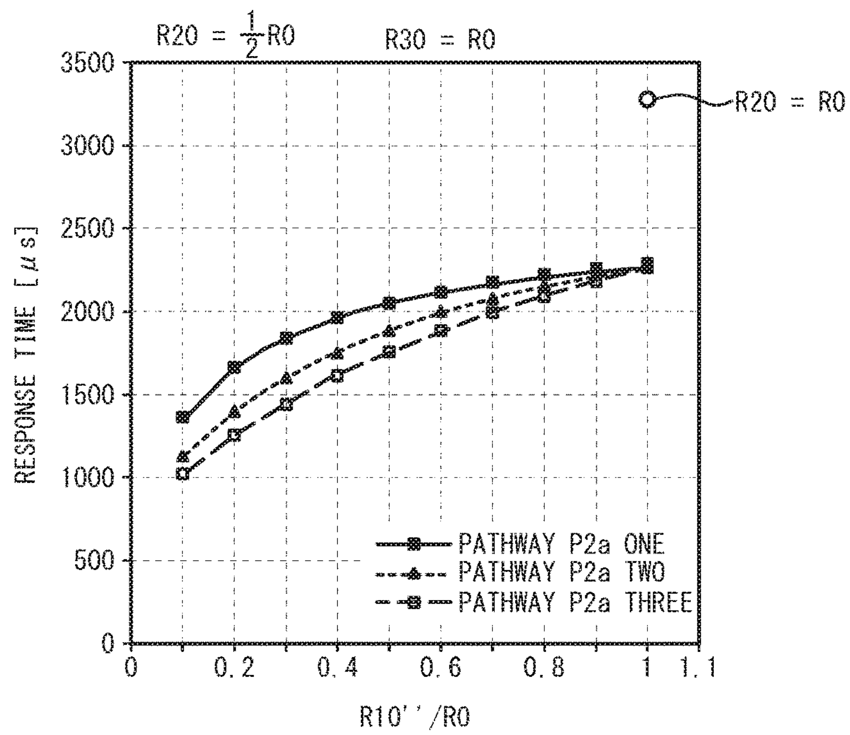
FIG. 11A is a graph of response time versus R10"/R0 of one of pathways.

FIG. 11A is a graph of response time versus R10"/R0 in one pathway P2*a*. The resistances R10 not to be varied are fixed to the initial value R0, all R20 are fixed to ½ of the initial value R0, and R30 are fixed to the initial value R0. The number of the pathways P2*a* of which the resistance is varied was varied from one to three. The open circle indicates the case where all the resistances R20 were made to be the initial value R0. As illustrated in FIG. 11A, even when the number of the pathways P2*a* of which the resistance is varied is one to three, the response time decreases, and as the number of the pathways P2*a* increases, the response time further decreases.

Figure 11B:
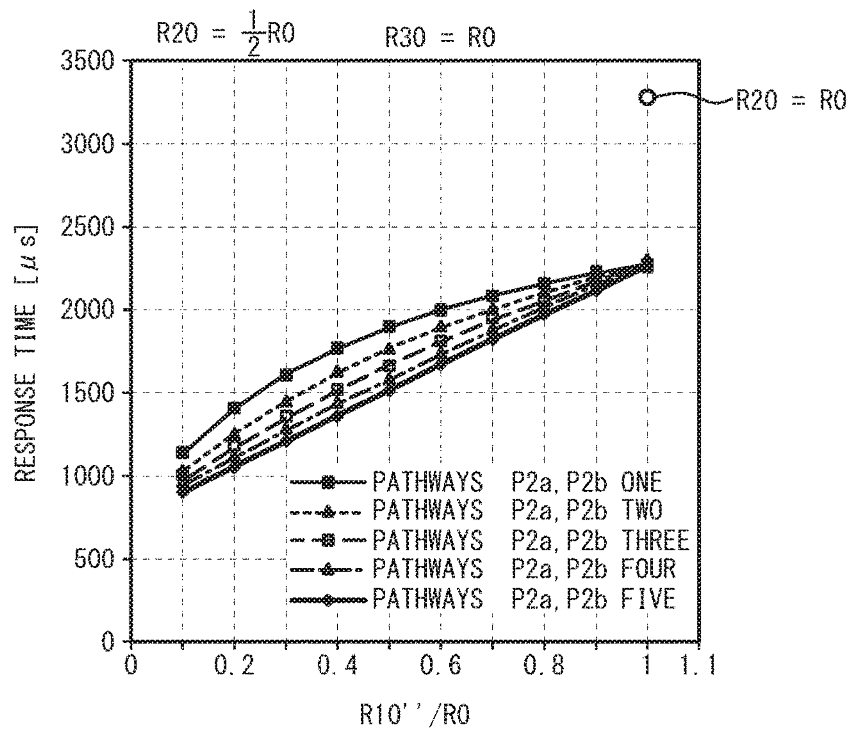
FIG. 11B is a graph of response time versus R10"/R0 of both pathways.

FIG. 11B is a graph of response time versus R10"/R0 in both the pathways P2*a* and P2*b*. The resistances R10 not to be varied are fixed to the initial value R0, all R20 are fixed to ½ of the initial value R0, and R30 are fixed to the initial value R0. The numbers of the pathways P2*a* and P2*b* of which the resistance is varied were varied from one to five. When the number is five, it means the resistances of the resistors R10 in all the pathways P2 are varied. As illustrated in FIG. 11B, the response time becomes shorter than that of FIG. 11A. As the number of the pathways P2 of which the resistance is varied increases, the response time further decreases.

As illustrated in FIG. 11A and FIG. 11B, when the resistances R20 of all the resistors R20 are fixed to ½ of the initial value R0 and at least one of the resistances R10 is made to be less than 1, the response time further decreases. When the resistance R10 is made to less than ½ of the initial value R0, the response time still further decreases.

As described above, according to the simulations 1 and 2 in the first embodiment, a plurality of the resistors R10 (first resistors) are connected between a plurality of the nodes N10 (first nodes), which are located between adjacent capacitors of a plurality of the capacitors C10 and C20, and the variable terminal Tp, the capacitors C10 and C20 having a variable capacitance and being connected in series between the signal terminal Ts1 (a first signal terminal) and the signal terminal Ts2 (a second signal terminal). One or more resistors R20 (second resistors) are connected between one or more nodes N20 (second nodes), which are located between the adjacent capacitors, and the fixed terminal Tg. The resistors R30 (a third resistor) are connected between the nodes N30 (third nodes) located closest to the signal terminals T1 and T2 and the fixed terminal Tg.

In the above-described variable capacitor, all the resistances R20 of the resistors R20 are made to be less than 1 and equal to or greater than ½ with respect to the initial value R0 of the resistance of the resistor R30. Each of the resistances R20 of the resistors R20 is not equal to at least one of the resistances R10 of the resistors R10. The response time can be reduced by making R20/R0 less than 1 and equal to or greater than ½ as described above.

In addition, at least one of the resistances of the resistors R10 is made to be less than 1 with respect to the initial value R0 of the resistance of the resistor R30. The at least one of the resistances of the resistors R10 is not equal to any one of the resistances of the resistors R20. The response time can be reduced by making R10/R0 less than 1 in at least one of the resistors R10 as described above.

As least one of the resistances R10 is preferably less than all the resistances of one or more resistors R20. This configuration can further reduce the response time.

All the resistances of the resistors R20 are approximately ½ with respect to the initial value R0 of the resistance of the resistor R30. This configuration can further reduce the response time.

None of the resistances of the resistors R20 is equal to any one of the resistances of the resistors R10. In addition, all the resistances of the resistors R10 are preferably less than 1 with respect to the resistance of the resistor R30. This configuration can further reduce the response time.

As illustrated in FIG. 1 and FIG. 8, the number of the resistors R10 is two or more. The number of the resistors R20 is one or more. The number of the resistors R30 is one or two. In the simulations 1 and 2, among the resistors R10, all the resistances of the resistors R10 of which the resistance is varied were made to be the same, and all the resistances of the resistors R10 of which the resistance is fixed were made to be the same. The resistances may differ from each other among the resistors R10 of which the resistance is varied. The resistances may differ from each other among the resistors R10 of which the resistance is fixed. The same applies to the resistors R20 and R30.

As illustrated in FIG. 8, the nodes N10 and N20 are alternately located. In this case, when an even number of capacitors are connected in series between the signal terminals Ts1 and Ts2, both two nodes located closest to the signal terminals Ts1 and Ts2 can be coupled to the fixed terminal Tg. When an odd number of capacitors are connected in series between the signal terminals Ts1 and Ts2, usually, only one of two nodes located closest to the signal terminals Ts1 and Ts2 can be coupled to the fixed terminal Tg. In this case, the first embodiment cannot be applied. However, when an even number of capacitors are connected in series between the signal terminals Ts1 and Ts2, one capacitor may be replaced with two series capacitors each having a capacitance twice the capacitance of the one capacitor. In this case, an odd number of capacitors are connected in series between the signal terminals Ts1 and Ts2 as a whole, but both the two nodes N30 located closest to the signal terminals Ts1 and Ts2 can be occasionally coupled to the fixed terminal Tg. In this case, the first embodiment can be applied.

Figure 12:
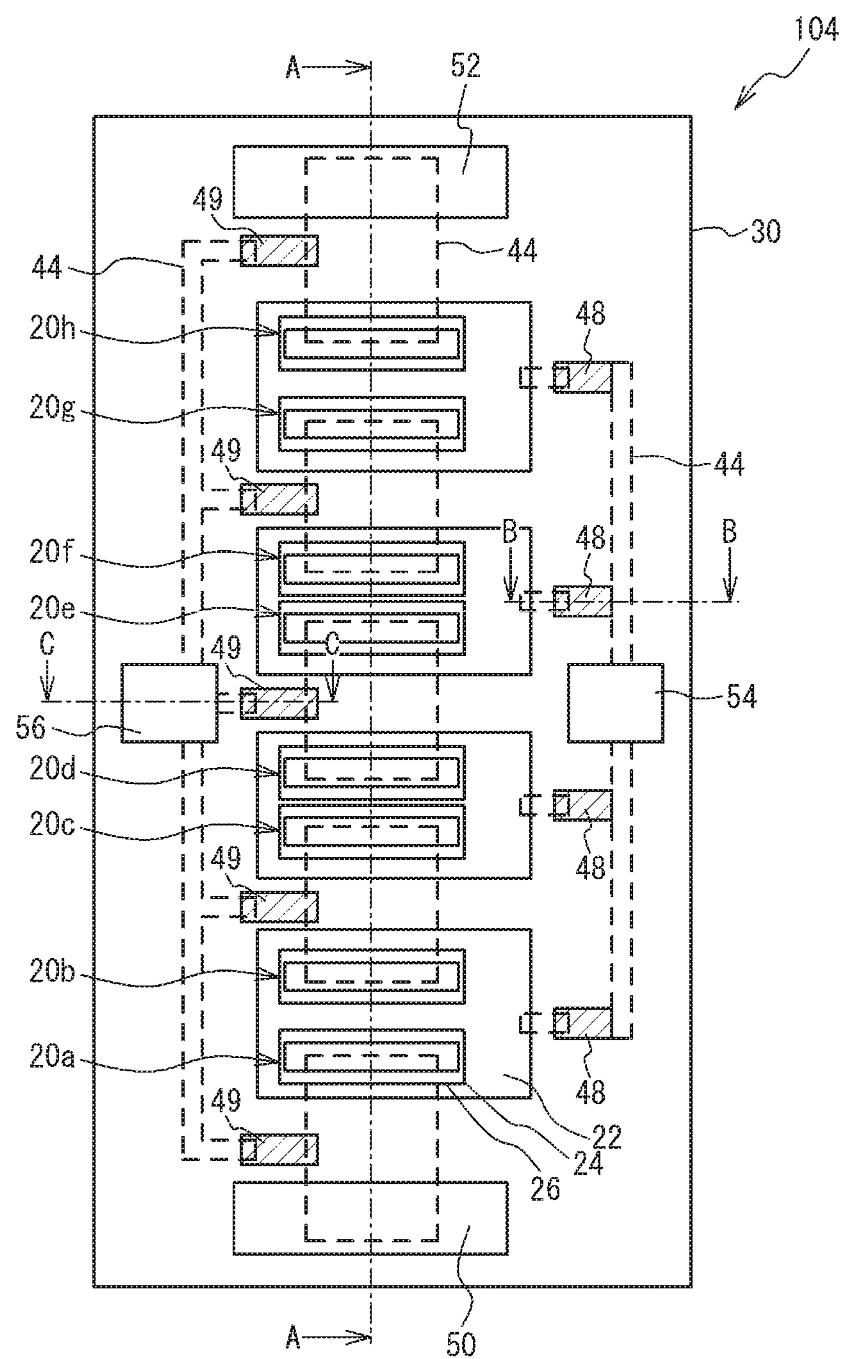
FIG. 12 is a plan view of an exemplary variable capacitor of the first embodiment.
Figure 13:
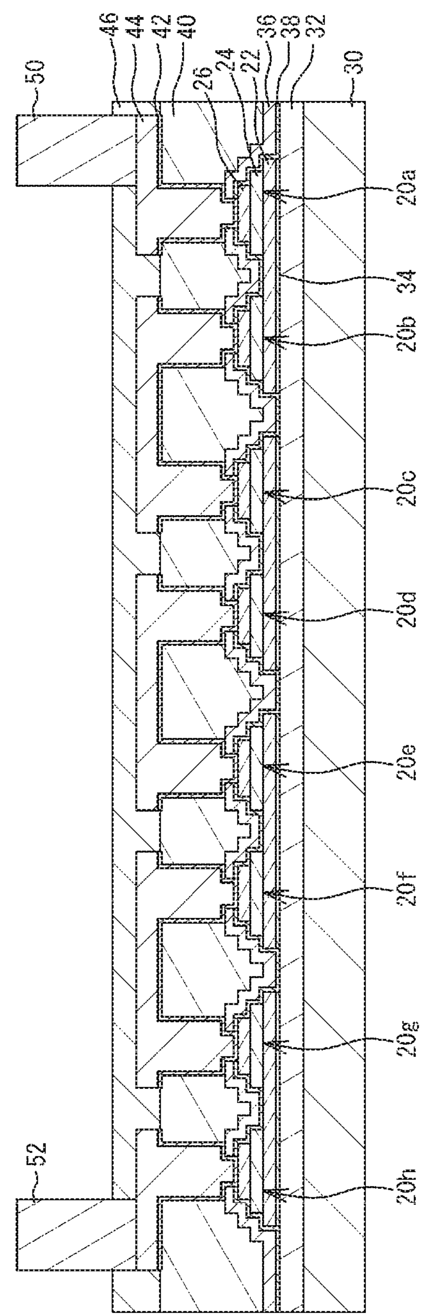
FIG. 13 is a cross-sectional view taken along line A-A in FIG. 12.

A description will next be given of a plan view and a cross-sectional view of the variable capacitor in accordance with the first embodiment by using a variable capacitor in which eight capacitors are connected in series as an example. FIG. 12 is a plan view of an exemplary variable capacitor of the first embodiment, and FIG. 13 is a cross-sectional view taken along line A-A in FIG. 12. In FIG. 12, a wiring layer 44 is indicated by dashed lines, and the illustration of the insulating film is omitted.

As illustrated in FIG. 12 and FIG. 13, in the example of the first embodiment, a variable capacitor 104 includes a plurality of capacitors 20*a* through 20*h* formed on a support substrate 30 having an upper surface on which an insulating film 32 is formed. The support substrate 30 is, for example, a silicon (Si) substrate with a thickness of 200 μm. The insulating film 32 is, for example, a silicon oxide ($SiO_2$) film with a thickness of 1 μm. The support substrate 30 may be an insulating substrate such as, for example, a quartz substrate, an alumina substrate, a sapphire substrate, or a glass substrate, or a conductive substrate (preferably, a high resistance substrate) such as Si. When an insulating substrate is used, the insulating film on the upper surface can be omitted. When a conductive substrate is used, an insulating film is preferably formed on the upper surface.

Each of the capacitors 20*a* through 20*h* includes a lower electrode 22 formed on the insulating film 32 across an adhesion layer 38, a dielectric layer 24 formed on the lower electrode 22, and an upper electrode 26 formed on the dielectric layer 24. The adhesion layer 38 may not be necessarily formed. The lower electrodes 22 of the capacitors 20*a* and 20*b* are interconnected, and the capacitors 20*a* and 20*b* share the single lower electrode 22. Similarly, the capacitors 20*c* and 20*d*, the capacitors 20*e* and 20*f*, and the capacitors 20*g* and 20*h* share the corresponding single lower electrode 22 by interconnecting the respective lower electrodes 22. The lower electrodes 22 may not be interconnected, and may be separated and electrically interconnected by separate wiring lines.

The lower electrode 22 and the upper electrode 26 are made of, for example, platinum (Pt) with a thickness of 250 nm. The dielectric layer 24 is, for example, a BST ($Ba_XSr_{1-X}TiO_3$) layer with a thickness of 90 nm to which manganese (Mn) is added, and the composition ratio is X=0.5, i.e., $Ba_{0.5}Sr_{0.5}TiO_3$. To improve leakage characteristics, for example, niobium (Nb) other than Mn may be added, or to improve other characteristics such as pressure resisting characteristics, a trace of other additives may be added. The composition ratios of Ba and Sr are not limited to the case of X=0.5, and the composition ratios may be appropriately changed. In addition, the dielectric layer 24 may be made of a ferroelectric (for example, a dielectric having a perovskite structure) other than BST.

The adhesion layer 38 is, for example, a titanium (Ti) layer or a titanium oxide ($TiO_X$) layer. The lower electrode 22 and the upper electrode 26 may be made of, for example, noble metal such as iridium (Ir) or ruthenium (Ru), or conductive oxide such as strontium ruthenate ($SrRuO_3$), ruthenium oxide ($RuO_2$), or iridium oxide ($IrO_2$).

The capacitors 20*a* and 20*h* and the capacitors 20*b* through 20*g* have approximately the same area of the region where the lower electrode 22 and the upper electrode 26 face each other across the dielectric layer 24.

An insulating film 36 that exposes the upper surface of the upper electrode 26 and covers the remaining region is formed on the insulating film 32. The insulating film 36 is formed across the adhesion layer 38 made of, for example, titanium oxide ($TiO_X$), but the adhesion layer 38 may not be necessarily formed. The insulating film 36 is, for example, an aluminum oxide ($Al_2O_3$) film with a thickness of 100 nm. The insulating film 36 may be, for example, a silicon nitride (SiN) film, a tantalum oxide ($Ta_2O_5$) film, or a strontium titanate ($SrTiO_3$) film instead of an $Al_2O_3$ film. The insulating film 36 may be a single-layer film of one of them, or a multilayered film of at least two of them.

An insulating film 40 including apertures that expose the upper surface of the upper electrode 26 is formed on the insulating film 36. The wiring layer 44 is embedded in the apertures of the insulating film 40 across a seed layer 42. The seed layer 42 may not be necessarily formed. An insulating film 46 is formed on the insulating film 40 and the wiring layer 44. The insulating films 36, 40, and 46 have a function as a protective film. The capacitors 20*a* through 20*h* are connected in series between signal terminals 50 and 52 by the wiring layer 44. In addition, the capacitors 20*a* through 20*h* are connected in parallel between a variable terminal 54 and a fixed terminal 56 by the wiring layer 44. Each of the terminals 50 through 56 is formed of a multilayered film with a thickness of, for example, 10 μm in which Cu, Ni, and tin (Sn) are stacked in this order. Each of the terminals 50 through 56 may be made of gold (Au) or solder. The signal terminals 50 and 52 respectively correspond to the signal terminals Ts1 and Ts2, and the variable terminal 54 and the fixed terminal 56 respectively correspond to the variable terminal Tp and the fixed terminal Tg.

The insulating films 40 and 46 are, for example, a polyimide film with a thickness of 3 μm. The wiring layer 44 is formed of, for example, copper (Cu) plating with a thickness of 4 μm. The seed layer 42 is formed of, for example, a multilayered film of tantalum nitride (TaN), tantalum (Ta), and Cu. The insulating films 40 and 46 may be an inorganic insulating film such as, for example, a $SiO_2$ film or a SiN film, or an organic insulating film such as benzocyclobutene (BCB) resin. The wiring layer 44 may be made of a conductive material such as aluminum (Al) or aluminum alloy (AlSi or AlCu). For the seed layer 42, nitride such as titanium nitride (TiN), titanium silicide nitride (TiSiN), or tantalum silicide nitride (TaSiN), or oxide such as $SrRuO_3$ or $IrO_2$ may be used instead of TaN of the multilayered film of TaN, Ta, and Cu.

Figure 14A:
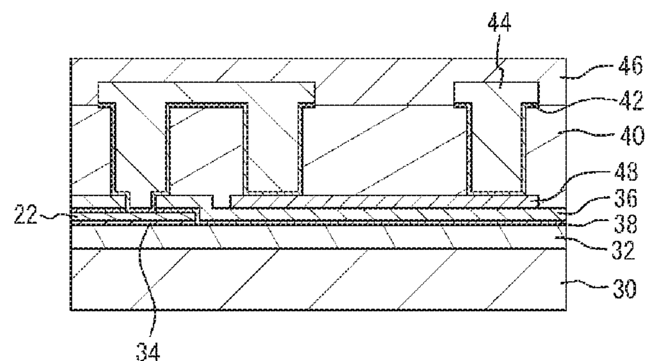
FIG. 14A is a cross-sectional view taken along line B-B in FIG. 12.
Figure 14B:
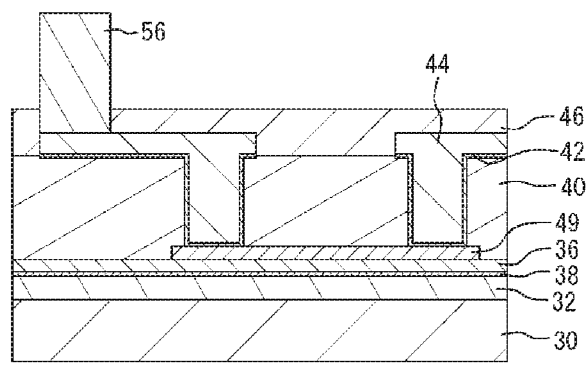
FIG. 14B is a cross-sectional view taken along line C-C in FIG. 12.

FIG. 14A is a cross-sectional view taken along line B-B in FIG. 12, and FIG. 14B is a cross-sectional view taken along line C-C in FIG. 12. As illustrated in FIG. 12 and FIG. 14A, a resistance film 48 is formed on the insulating film 36. The resistance film 48 is connected between the variable terminal 54 and the lower electrode 22 through the wiring layer 44. The resistance film 48 corresponds to the resistors R20 and R30 in FIG. 8. As illustrated in FIG. 12 and FIG. 14B, a resistance film 49 is formed on the insulating film 36. The resistance film 49 is connected between the fixed terminal 56 and the upper electrode 26 through the wiring layer 44. The resistance film 49 corresponds to the resistors R10 in FIG. 8. The resistance films 48 and 49 are, for example, a TaSiN film with a thickness of 80 nm. The resistance films 48 and 49 may be a high resistance film made of Ni—Cu alloy or Fe—Cr—Al alloy. The resistance films 48 and 49 are not necessarily formed on the insulating film 36, and may be formed in other places.

Second Embodiment

Figure 15:
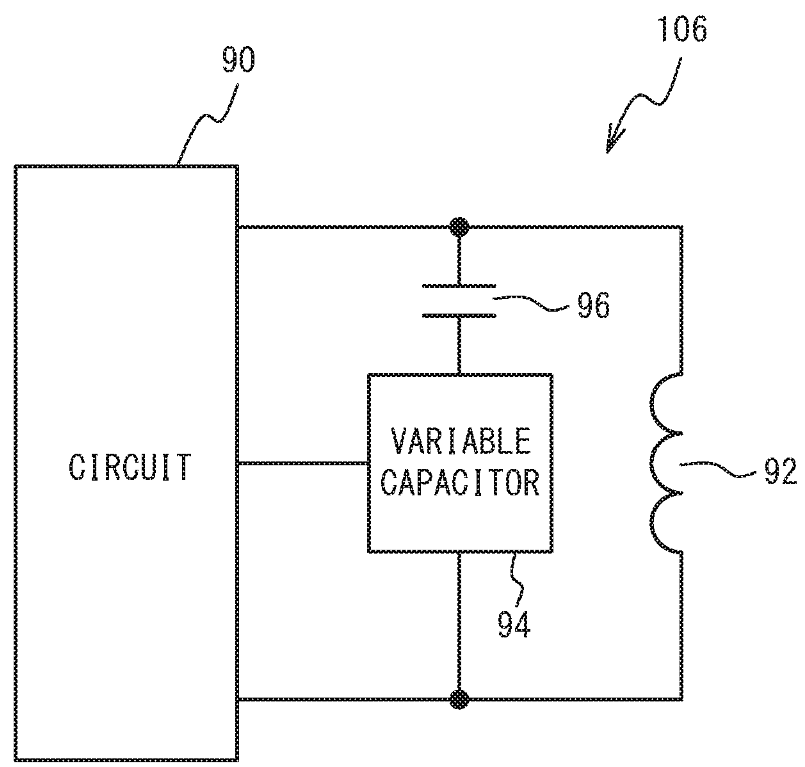
FIG. 15 illustrates an electronic device in accordance with a second embodiment.

FIG. 15 illustrates an electronic device in accordance with a second embodiment. As illustrated in FIG. 15, the electronic device is an antenna circuit 106 of an unbalance operation. The antenna circuit 106 includes a circuit 90, an antenna coil 92 connected in parallel to the circuit 90, a variable capacitor 94, and a capacitor 96 for removing direct current. The circuit 90 processes reception signals received through the antenna coil 92. The circuit 90 controls the supply of a DC bias voltage to the variable capacitor 94. The variable capacitor 94 can be the variable capacitor described in the first embodiment and the variation thereof.

Although the embodiments of the present invention have been described in detail, it is to be understood that the various change, substitutions, and alterations could be made hereto without departing from the spirit and scope of the invention.

What is claimed is:

1. A variable capacitor comprising:

a plurality of capacitors that are connected in series between a first signal terminal and a second signal terminal, and of which capacitances vary in accordance with a variable voltage applied to a variable terminal, an AC signal being provided between the first signal terminal and the second signal terminal;

a plurality of first resistors each connected between a corresponding one of a plurality of first nodes and the variable terminal, the plurality of first nodes being included in nodes between adjacent capacitors of the plurality of capacitors;

one or more second resistors each connected between a corresponding one of one or more second nodes and a fixed terminal to which a fixed voltage is applied, the one or more second nodes being included in the nodes between the adjacent capacitors; and a third resistor that is connected between at least one of third nodes and the fixed terminal, one of the third nodes being located between the first signal terminal and a capacitor that is located closest to the first signal terminal among the plurality of capacitors, another one of the third nodes being located between the second signal terminal and a capacitor that is located closest to the second signal terminal among the plurality of capacitors, wherein the at least one of the resistances of the plurality of first resistors is less than all the resistances of the one or more second resistors, and wherein each of the resistances of the one or more second resistors is not equal to at least one of resistances of the plurality of first resistors, and wherein the at least one of the resistances of the plurality of first resistors is less than 1 with respect to the resistance of the third resistor, and wherein all resistances of the one or more second resistors are less than 1 and equal to or greater than ½ with respect to a resistance of the third resistor.

2. An electronic device comprising:

the variable capacitor according to claim 1.

3. The variable capacitor according to claim 1, wherein all the resistances of the plurality of first resistors are less than 1 with respect to the resistance of the third resistor.

4. The variable capacitor according to claim 1, wherein the resistances of the plurality of first resistors are more than 10000 times impedance values of the plurality of capacitors.

5. The variable capacitor according to claim 1, wherein the resistance of the third resistor is 1/50 or less of leakage resistance components of the plurality of capacitors.

6. The variable capacitor according to claim 1, wherein each of the resistances of the one or more second resistors is not equal to any one of the resistances of the plurality of first resistors.

* * * * *